United States Patent [19]

Lunsford

[11] Patent Number: 5,030,850
[45] Date of Patent: Jul. 9, 1991

[54] OFF-SET STABILIZER FOR COMPARATOR OUTPUT

[75] Inventor: James S. Lunsford, Los Alamos, N. Mex.

[73] Assignee: The United States of America as represented by the Department of Energy, Washington, D.C.

[21] Appl. No.: 484,321

[22] Filed: Feb. 26, 1990

[51] Int. Cl.$^5$ .................................................. H03K 5/153
[52] U.S. Cl. .................................... 307/358; 307/491; 307/494
[58] Field of Search ............... 307/358, 359, 354, 351, 307/491, 494; 328/151

[56]  References Cited

U.S. PATENT DOCUMENTS

| | | | |
|---|---|---|---|
| 3,797,894 | 3/1974 | Carp | 307/358 |
| 3,804,979 | 4/1974 | Knowles | 307/358 |
| 4,160,175 | 7/1979 | Trout | 307/358 |
| 4,217,553 | 8/1980 | Winebarger | 307/358 |
| 4,613,950 | 9/1986 | Knierim et al. | |
| 4,635,142 | 1/1987 | Haugland | 307/358 |

FOREIGN PATENT DOCUMENTS 0071319 5/1980 Japan .................................... 307/358

OTHER PUBLICATIONS

R. Nutt, "Digital Time Intervalometer," 39 Rev. Sci. Instr. No. 9, pp. 1342–1345.

Primary Examiner—John Zazworsky
Attorney, Agent, or Firm—Ray G. Wilson; Paul D. Gaetjens; William R. Moser

[57]  ABSTRACT

A stabilized off-set voltage is input as the reference voltage to a comparator. In application to a time-interval meter, the comparator output generates a timing interval which is independent of drift in the initial voltage across the timing capacitor. A precision resistor and operational amplifier charge a capacitor to a voltage which is precisely offset from the initial voltage. The capacitance of the reference capacitor is selected so that substantially no voltage drop is obtained in the reference voltage applied to the comparator during the interval to be measured.

3 Claims, 3 Drawing Sheets

OFF-SET STABILIZER FOR COMPARATOR OUTPUT

This invention is the result of a contract with the Department of Energy (Contract No. W-7405-ENG-36).

BACKGROUND OF THE INVENTION

The present invention is generally related to precision measurements using comparators and, more particularly, to time expansion circuits for pulse counting in time interval meters.

It is frequently necessary to provide precise measurements of time intervals in the sub-microsecond range. In one technique, a capacitor is rapidly charged during an event timing interval and then slowly discharged after the event. Typical time interval meters are illustrated in R. Nutt, "Digital Time Intervalometer," 39 Rev. Sci. Instr. No. 9, pp. 1342-1345 (Sept. 1968) and U.S. Pat. No. 4,613,950, "Self-Calibrating Time Interval Meter," issued Sept. 23, 1986, to D. Knierim et al., incorporated herein by reference.

In a time interval expansion-type meter, a capacitor is rapidly charged during a time interval to be measured and is thereafter discharged at a much slower rate after the event time interval. The capacitor discharges until it reaches a reference potential, typically ground potential, whereupon a comparator indicates the end of the slow ramp period. A precision clock source is typically included wherein the clock pulses are counted during the capacitor discharging for precise timing. The number of clock pulses counted during the capacitor discharge ramp are proportional to the duration of the discharge, which, in turn, has a known relationship with the capacitor charge ramp so that the event interval becomes known with precision.

Clock pulses are counted during the interval between the start of the discharge ramp and the time the discharge voltage equals a reference voltage. However, active circuit components must have a high bandwidth to accommodate the capacitor discharge/charge rates. Such components are generally temperature sensitive and the reference voltages which define the counting interval can drift. Capacitive coupling might be used to eliminate this dc drift, but such a circuit would have application only to events with very low repetition rates, with a concomitant increase in testing time. Circuit components having a limited bandwidth could also be used, but there would be a resulting nonlinearity.

It would be desirable to provide a ramp timing circuit which could define reference voltages for the timing interval which would enable the timing interval to be independent of voltage drift values.

This problem is addressed by the present invention, wherein a circuit is provided to establish a reference interval voltage as a function of the ramp start voltage so that equal capacitor discharge/charge voltage swings result in equal time interval measurements. Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the apparatus of this invention may comprise an electrical circuit for stabilizing a comparator output which is used, e.g., to establish a timing interval. A timing means provides for generating an initial voltage and a timing voltage. Operational amplifier means has a terminal for receiving the initial voltage and for generating an output voltage functionally related to the initial voltage. Latching means then provides for maintaining the output voltage as a reference voltage that is input to the comparator and to the operational amplifier during the timing voltage. Then the initial voltage establishes the reference voltage to eliminate the effect of drift in the initial voltage on the comparator output. Hence, in application to a timing circuit, the reference voltage which establishes the timing interval follows the initial voltage so any resulting timing interval is independent of the initial voltage value.

In another characterization of the present invention, a method for stabilizing a comparator output is provided. An initial voltage is established as one input to a comparator. A reference voltage is then established which is functionally related to the initial voltage and applied to a second input to the comparator. The output of the comparator then changes when an event voltage to the first comparator input is equal to the reference voltage at the second input so that the interval between changes is not dependent on the initial voltage value.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings.

DETAILED DESCRIPTION OF THE INVENTION

Figure 1:
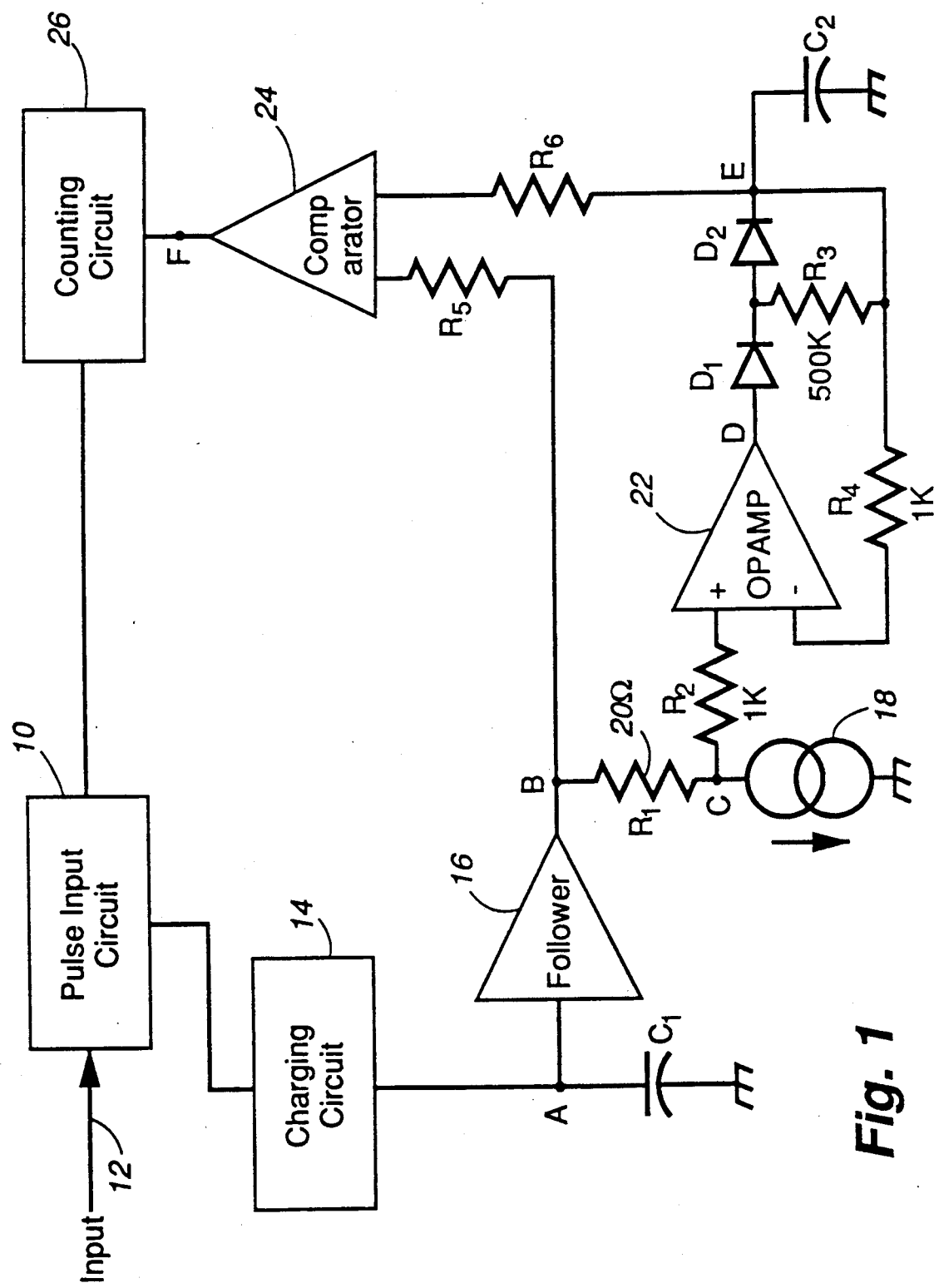
FIG. 1 is a schematic drawing in partial block diagram form of a stabilizing circuit according to the present invention.

Referring first to FIG. 1, there is shown a schematic in partial block diagram of one embodiment of the circuit according to the present invention with application to a time interval meter. Pulse input circuit 10 receives a data pulse 12. Input circuit 10 initializes charging circuit 14 and counting circuit 26 whereby charging circuit 14 provides for a rapid charge of capacitor C1 for the duration of input pulse 12 and counting circuit 26 initiates the count for an internal precision clock. Circuits 10, 14 and 26 are conventional, such as taught by the references hereinabove incorporated by reference, and are not further discussed herein.

The voltage A appearing across capacitor C1 forms the ramp event voltages, such as determined by the duration or magnitude of an event. Voltage follower 16 tracks the capacitor C1 voltage A and outputs a tracking voltage B to a first terminal of comparator 24. Comparator 24 has a reference voltage input E to a second terminal. When the timing voltage input B from follower 16 exceeds the reference voltage E, comparator 24 outputs a signal F to counting circuit 26 to define the expanded time interval for clock pulse counting. It will be appreciated that the relationship between the initial voltage across capacitor C1 and the reference voltage E must be reproducibly determinable in order to provide reproducible timing output voltages from comparator 24. If reference voltage E can drift relative to an initial event voltage B then reproducible interval signals F will not be obtained for input pulses 12 having equal durations.

In accordance with the present invention, reference voltage E is maintained in a fixed relationship with initial timing voltage B. The circuit herein described provides a precision 0.1 V offset. Now the voltage swing across comparator 24 will be identical for identical input pulses 12 and identical timing signal F durations will be obtained. Basically, operational amplifier 22 connects follower output voltage B to charge reference capacitor C2 wherein reference voltage E is in a constant relationship with follower voltage B. When the follower 16 output voltage B decreases, the positive input to operational amplifier 22 decreases below the negative input from reference voltage E and voltage output D goes below reference voltage E. At least one output diode D1 is provided to latch the voltage across capacitor C2 at the timing reference voltage E. The output voltage F from comparator 24 will switch as timing voltage B decreases below reference voltage E during capacitor C1 charge and will switch again as voltage B increases above reference voltage E during the expanded capacitor C1 discharge interval. Since comparator 24 and operational amplifier 22 have extremely high input impedances (ideally the input impedances are infinite), any voltage discharge from capacitor C2 will be too small to affect the timing interval and resulting precision count in counting circuit 26.

The stabilizing circuit for reference voltage E more particularly provides reference voltage C at a precise offset voltage from timing voltage B so that comparator 24 switching occurs on ramp portions of the capacitor C1 voltage. Precision current source 18 provides current through precision resistor R1 to establish operational amplifier 22 input voltage C at a precise offset from timing voltage B. Output voltage D is provided through diodes D1 and D2 across capacitor C2. At least one diode D1 is desired to latch capacitor C2 when voltage D decreases below reference voltage E. Diode D2 and resistor R3 may be provided for further stability. Resistors R2, R4, R5, and R6 are provided as fault current limiting resistors. Timing capacitor C1 is preferably a ceramic chip, NPO-type, with a low temperature coefficient and low leakage current. Reference capacitor C2 is preferably a tantalum chip capacitor having a low leakage current. In a reference design C2 is comprised of two capacitors in parallel to obtain the desired capacitance. Resistor R1 is a high precision, low noise resistor having a low temperature coefficient. Operational amplifier 22, current source 18, and comparator 24 must all have good dc stability. Voltage follower 16 should have good gain stability, a high input resistance, and a high bandwidth to accurately track the voltage across capacitor C1. Current source 18 should have a high output impedance and low noise.

Figure 2:
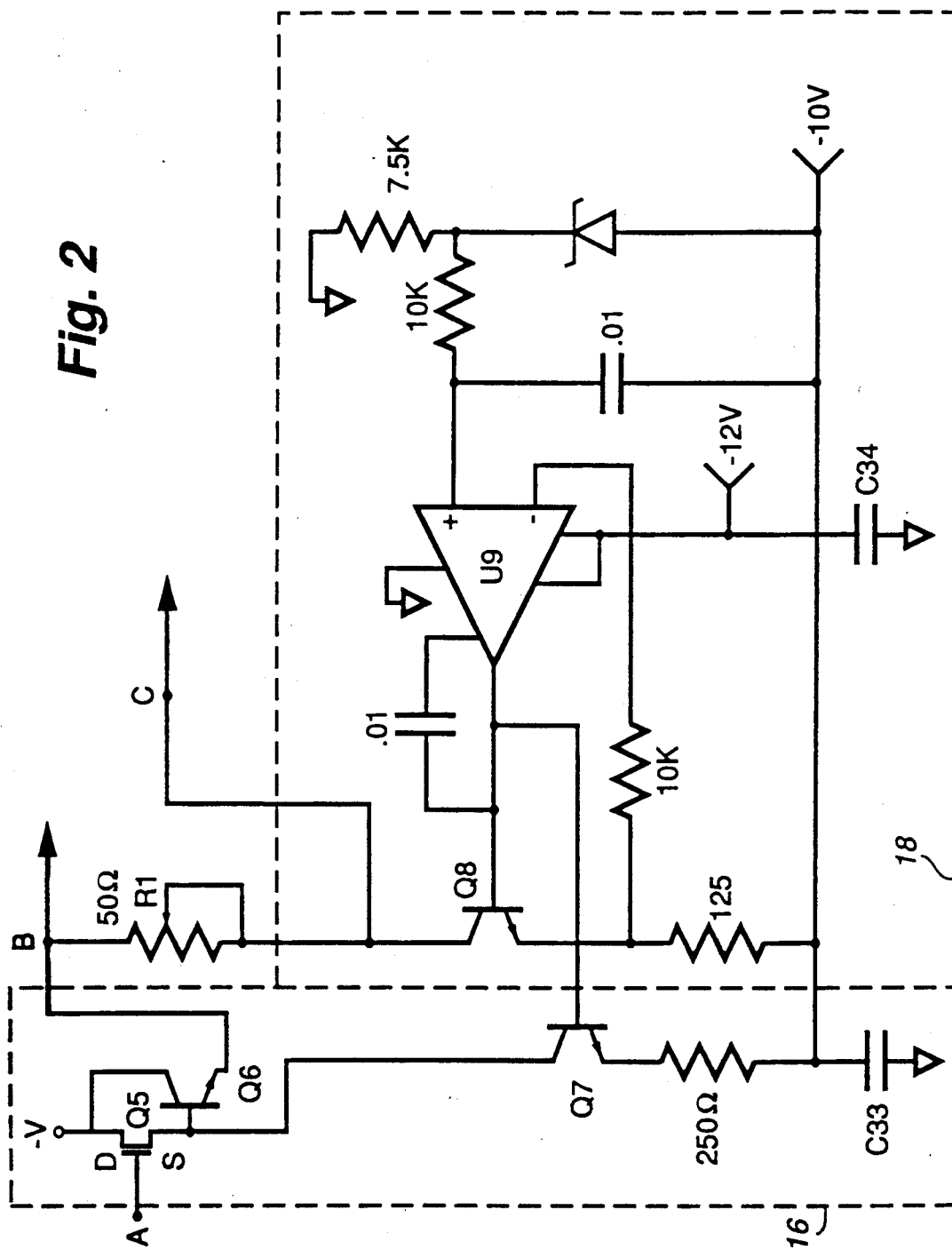
FIG. 2 depicts detailed schematics for the voltage follower and current source shown in block diagram in FIG. 1.

FIG. 2 shows detailed schematic embodiments for the voltage follower circuit 16 and current source circuit 18 shown in block diagram form in FIG. 1. Voltage follower circuit 16 provides field effect device Q5 for outputting the voltage at A (FIG. 1) to the base of transistor Q6 without loading node A. The emitter voltage of transistor Q6 is output to node B for one input to comparator 24. Current source 18 includes amplifier U9 and transistor Q8. The output of amplifier U9 is input to the bases of transistors Q7, Q8. Feedback from the voltage across the 125 ohm resistor in the emitter circuit of transistor Q8 provides a constant voltage across and concomitant current from nodes B and C to establish a reference offset voltage across resistor R1.

Exemplary component values for the circuits shown in FIGS. 1 and 2 are set out in Table A.

TABLE A

| Circuit Designation | Component |
|---|---|
| C1 | 200 pF |
| C2 | Johanson 500 R11N201-J |
|  | two 30 µF capacitors |
| R1 | Sprague 194D-156-XO-020F2 |
|  | 20 ohms |
| R2 | 1K ohms |
| R3 | 500K ohms |
| R4 | 1K ohms |
| R5 | 100 ohms |
| R6 | 100 ohms |
| Current Source 18 Network | U9 - LT 1028 |
|  | Q8 - MMC 5089 |
| Voltage Follower 16 Network | Q5 - MMC 4416 |
|  | Q6 - MMC 3904 |
|  | Q7 - MMC 5089 |
| Operational Amplifier 22 | LT 1028 |
| Comparator 24 | AD 9685 |

Figure 3:
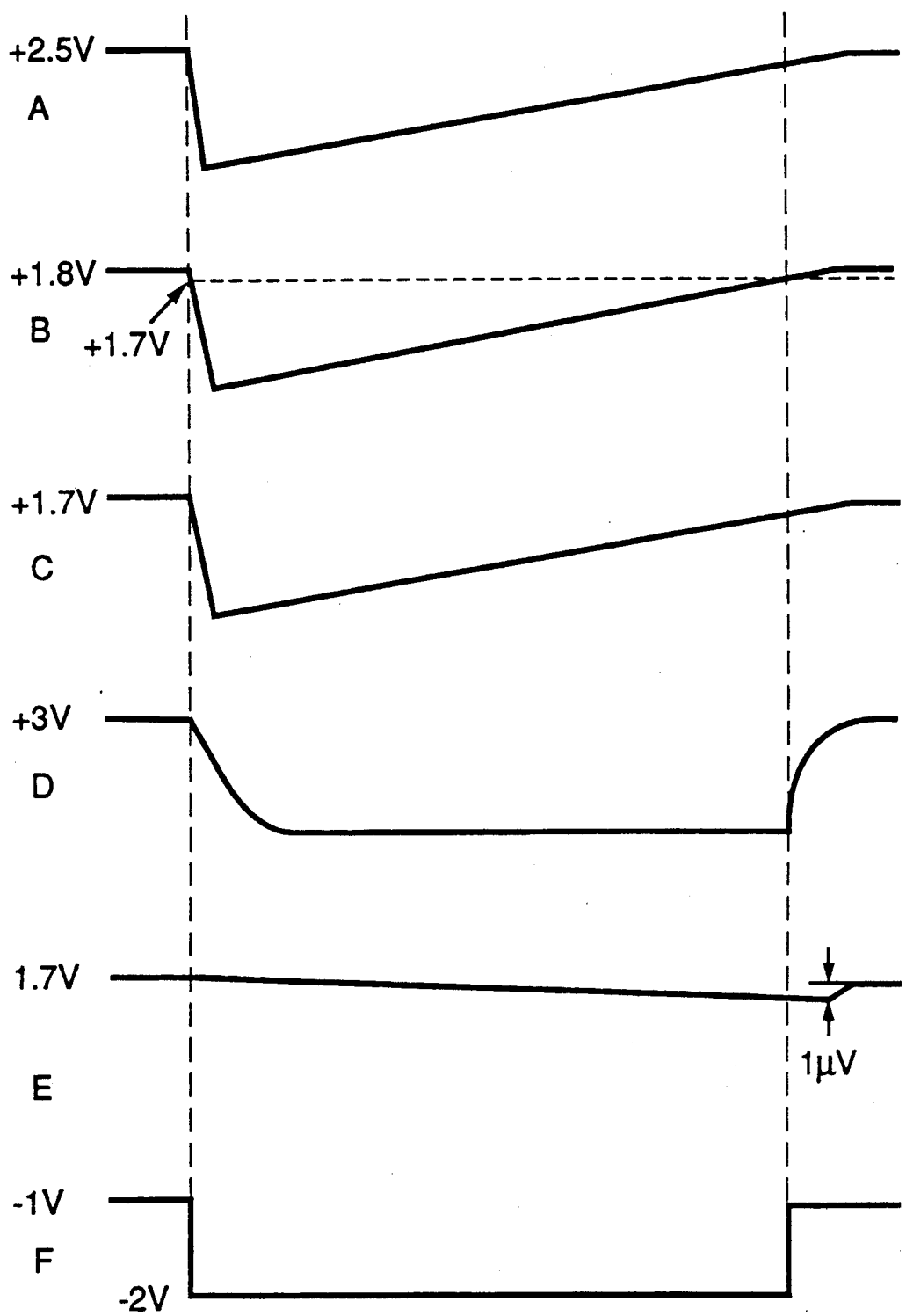
FIG. 3 is a timing diagram of voltages at selected nodes of the circuit shown in FIG. 1.

The system voltages are depicted during an exemplary timing interval in FIG. 3. As the timing voltage A decreases, follower voltage B decreases. In one embodiment a precise offset voltage of 100 mV is generated so that voltage C and concomitant reference voltage E are 100 mV below voltage B. As voltage B decreases below reference voltage E, voltage C decreases below reference voltage E, wherein voltage D goes to an applied bias voltage and latches reference voltage E. Comparator output voltage F switches to initiate a counting interval. When timing voltage A increases, voltage B also increases. When voltage B reaches the value of reference voltage E (shown by the horizontal dashed line, the comparator output voltage F again switches to terminate the counting interval. For the component values shown in Table A, reference voltage E has only an insubstantial decrease, about 1 microvolt. Thus, the duration of the timing pulse represented by voltage F is independent of the initial voltage B since the reference voltage E is in a fixed relationship with voltage B. Any drift in voltage B is simply reflected in a concurrent drift in reference voltage E.

In application to a conventional time-expansion type of time-interval meter interpolator design, the stabilizing circuit described above improved the differential linearity by 10:1 down to 1 ps, while achieving a temperature drift of less than 0.2% over a temperature range of 0°-30° C. While the above discussion concerns application of the stabilized comparators to time-interval measurement devices, it will be appreciated that the stabilized comparators have application to other devices requiring distinct state changes, e.g., discriminators.

The foregoing description of an embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An electrical circuit for stabilizing an output from a comparator having a duration functionally related to an event parameter, comprising:
    timing means for generating on an input node connected to said comparator an initial voltage prior to said event and a ramped timing voltage functionally related to said event parameter;
    a precision current source;
    a precision resistor connected between said input node and said precision current source for providing a first reference voltage that is offset a precise amount from said initial voltage;
    operational amplifier means for receiving said first reference voltage and generating a second reference voltage functionally related to said initial voltage; and
    latching means for maintaining said second reference voltage for input to said comparator and to said operational amplifier means during said timing voltage,
    whereby said initial voltage establishes said second reference voltage to eliminate an effect of drift in said initial voltage on said output from said comparator.

2. A circuit according to claim 1, wherein said latching means includes:
    a capacitor connected for charging to said second reference voltage from said operational amplifier means; and
    diode means for latching said second reference voltage on said capacitor when said second reference voltage output from said operational amplifier means decreases below said second reference voltage on said capacitor.

3. A method for stabilizing a comparator output, having a duration functionally related to an event parameter comprising the steps of:
    establishing an initial voltage to one input of a comparator followed by an event voltage functionally related to said event parameter;
    establishing a precise voltage drop from said initial voltage to define an input voltage to an operational amplifier;
    charging a capacitor with an output from said operational amplifier to define a reference voltage having a precise offset from an initial voltage;
    latching said reference voltage across said capacitor when said initial voltage decreases below said reference voltage; and
    inputting said reference voltage to said operational amplifier and to a second input of said comparator,
    wherein an output of said comparator changes when said event voltage applied to said one input is equal to said reference voltage.

* * * * *